United States Patent
Sakai et al.

(10) Patent No.: US 7,476,559 B2
(45) Date of Patent: Jan. 13, 2009

(54) THIN FILM PATTERN SUBSTRATE, METHOD FOR MANUFACTURING DEVICE, ELECTRO-OPTIC DEVICE, AND ELECTRONIC APPARATUS

(75) Inventors: Shinri Sakai, Suwa (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 49 days.

(21) Appl. No.: 11/256,606

(22) Filed: Oct. 21, 2005

(65) Prior Publication Data
US 2006/0092191 A1 May 4, 2006

(30) Foreign Application Priority Data
Nov. 1, 2004 (JP) ............................. 2004-317559

(51) Int. Cl.
*H01L 21/208* (2006.01)
(52) U.S. Cl. .......... 438/30; 257/E21.174; 257/E23.175; 430/20
(58) Field of Classification Search ................... 257/79, 257/E33.001, E21.535, E23.175, E21.174; 438/29–30, 674, 584, 758; 430/20, 320
See application file for complete search history.

(56) References Cited

U.S. PATENT DOCUMENTS

| | | | |
|---|---|---|---|
| 6,060,113 A * | 5/2000 | Banno et al. | 427/78 |
| 6,761,925 B2 * | 7/2004 | Banno et al. | 427/78 |
| 6,861,377 B1 | 1/2005 | Hirai et al. | |
| 7,342,288 B2 | 3/2008 | Fujii et al. | |
| 2002/0067400 A1 * | 6/2002 | Kawase et al. | 347/101 |
| 2002/0151161 A1 * | 10/2002 | Furusawa | 438/597 |
| 2003/0030689 A1 * | 2/2003 | Hashimoto et al. | 347/20 |
| 2003/0146692 A1 * | 8/2003 | Uchida | 313/504 |
| 2004/0079254 A1 * | 4/2004 | Hasei | 101/485 |
| 2005/0163938 A1 * | 7/2005 | Yamazaki et al. | 427/554 |
| 2008/0129910 A1 | 6/2008 | Fujii et al. | |

FOREIGN PATENT DOCUMENTS

| | | |
|---|---|---|
| EP | 1478016 A | 11/2004 |
| EP | 1482556 A | 12/2004 |
| JP | 59-075205 | 4/1984 |
| JP | 2004-006700 A | 12/2005 |
| JP | 2005-353772 | 12/2005 |
| WO | 2004-023561 | 3/2004 |

OTHER PUBLICATIONS

Communication from European Patent Office regarding corresponding application.

* cited by examiner

*Primary Examiner*—Lynne A. Gurley
*Assistant Examiner*—Colleen Matthews
(74) *Attorney, Agent, or Firm*—Harness, Dickey & Pierce, P.L.C.

(57) ABSTRACT

A thin film pattern substrate on which a thin film pattern is formed by placing a functional liquid on the substrate, the thin film pattern includes a first domain area into which the functional liquid is infused and a second domain area on which the functional liquid infused into the first domain area flows, wherein the first domain area includes a plurality of linear patterns the width of which is narrower than the width of the first domain area, and the linear patterns forming the second domain area are connected to at least one of the plural linear patterns that constitute the first domain area.

7 Claims, 11 Drawing Sheets

P: SUBSTRATE

THIN FILM PATTERN SUBSTRATE, METHOD FOR MANUFACTURING DEVICE, ELECTRO-OPTIC DEVICE, AND ELECTRONIC APPARATUS

BACKGROUND

1. Technical Field

The present invention relates to a thin film pattern substrate on which a thin film pattern with a predetermined shape, such as a wiring, is formed, a method for manufacturing a device, an electro-optic device, and an electronic apparatus.

2. Related Art

Photolithography, for example, is used as a method for forming a thin film pattern for a wiring that is used for an electronic circuit, an integrated circuit or the like. However, photolithography requires huge facilities, such as a vacuum system, and complicated processes. Besides, the manufacturing cost is high because the yield rate is only a few percent and the bulk of material must be thrown out.

In the meanwhile, as disclosed, for example, in JP-A-59-75205, a method for forming a thin film pattern on a substrate by using a droplet discharge method, otherwise known as the inkjet method, for discharging a liquid material as a droplet from a liquid discharge head. In the method, a liquid material (a functional liquid) for a thin film pattern is directly placed on a substrate, and then is dried with heat treatment or laser irradiation or the like to form a film pattern. The film pattern includes a liquid infusing part for infusing a liquid material and a liquid flowing part on which liquid flows. The method has advantages of eliminating the need for photolithography, vastly simplifying the process, and suppressing the quantity of raw material to be used.

However, in recent years, circuits forming devices have become increasingly densified, therefore wirings, for example, also have to be finer and lines have to be thinner. In a thin film pattern forming method using the above-mentioned droplet discharge method, the discharged droplets spread over on the substrate after being discharged, making it difficult to form a refined thin film pattern stably.

In particular, in the case where the spreading of the droplets is not uniform, the liquid level of the liquid infusing part for infusing a liquid material and the liquid level of the liquid flowing part on which liquid flows are not equal, bringing a possibility that substantial liquid remains in the liquid infusing part causing a difference of film thickness between the liquid infusing part and the liquid flowing part. Further, there is a possibility that the separation of a liquid material (an ink) causes a defect to be brought about. Thus, it has been difficult to get a multilayer film with a refined pattern out of the method for manufacturing a device by piling films.

SUMMARY

An advantage of some aspects of the invention is to provide a film pattern substrate on which a refined and thinly striated film pattern can be formed precisely and stably, a method for manufacturing a device, and an electro-optic device and an electronic apparatus.

A first aspect of the invention is to provide a thin film pattern substrate on which a thin film pattern is formed by placing a functional liquid on the substrate. The substrate includes a first domain area into which the functional liquid is infused and a second domain area on which the functional liquid infused into the first domain area flows, wherein the first domain area includes a plurality of linear patterns the width of which is narrower than the width of the first domain area, and the linear patterns forming the second domain area are connected to at least one of the plural linear patterns that constitute the first domain area.

According to the first aspect of the invention, the pressure yielded by the surface tension of the functional liquid that is infused into the first domain area and the pressure yielded by the surface tension of the functional liquid that flows into the second domain area are always in balance because the second domain area is connected to at least one of the plural linear patterns. Further, because the curvature height of the functional liquid on the first domain area and the curvature height of the functional liquid on the second domain area are nearly equal after the functional liquid is discharged, the film thickness of the first domain area and the film thickness of the second domain area are almost equal after being dried. Therefore, a thin film pattern with minimal unevenness can be formed.

It is preferable that, on the thin film pattern substrate of the invention, the thin film pattern on the first domain area is formed in a lattice or in a pectination.

According to the first aspect of the invention, a substrate with a thin film pattern that is latticed or pectinate can be generated. The substrate is adoptable for an optical element.

It is preferable that, on the thin film pattern substrate of the invention, the film pattern on a place is formed the first domain area on the substrate is a lyophilic area comparted with a lyophobic area.

According to the first aspect of the invention, the functional liquid is easy to flow because the functional liquid passes through the lyophilic area comparted with the lyophobic area from the first domain area toward the second domain area. Therefore, a uniform thin film pattern with less unevenness can be formed.

It is preferable that, on the thin film pattern substrate of the invention, the functional liquid is infused into the first domain area using an ink jet method.

According to the first aspect of the invention, the functional liquid can be infused into the first domain area in multiple divided times because a flight diameter of the functional liquid can be controlled more finely from the starting point of the discharging until the contacting point onto the substrate. Specifically, a more uniform thin film pattern can be formed because the functional liquid flows into the second domain area in multiple divided times.

It is preferable that, on the thin film pattern substrate of the invention, the thin film pattern is conductive.

According to the first aspect of the invention, a thin film pattern can be formed as a wiring pattern. Specifically, the wiring pattern can be applied to various kinds of devices.

It is preferable that, on the thin film pattern substrate of the invention, the line width of the first domain area and the line width of the second domain area are almost equal.

According to the first aspect of the invention, the pressure of the functional liquid on the first domain area and the pressure of the functional liquid on the second domain area are almost equal because the functional liquid flows uniformly from the first domain area to the second domain area. Furthermore, the height of the functional liquid on the first domain area and the height of the functional liquid on the second domain area are also almost equal. Therefore, a substrate with a uniform thin film pattern with less unevenness can be formed.

A second aspect of the invention is to provide a method for manufacturing a device, wherein a thin film pattern is formed by placing a functional liquid onto a substrate. The method includes: forming a first domain area into which the functional liquid is infused, and forming a second domain area that is placed in connection to the first domain area so that the functional liquid flows into the first domain area.

According to the second aspect of the invention, a device that has a more refined film pattern with a uniform film thickness can be achieved.

A third aspect of the invention is to provide an electro-optic device that includes a device having a thin film pattern substrate.

According to the third aspect of the invention, an electro-optic device that is more accurate and miniaturizable can be provided due to a more refined device.

A fourth aspect of the invention is to provide an electronic apparatus that includes an above-mentioned electro-optic device.

According to the fourth aspect of the invention, an electronic apparatus that is more accurate can be provided due to an electro-optic device that is more accurate and miniaturizable.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
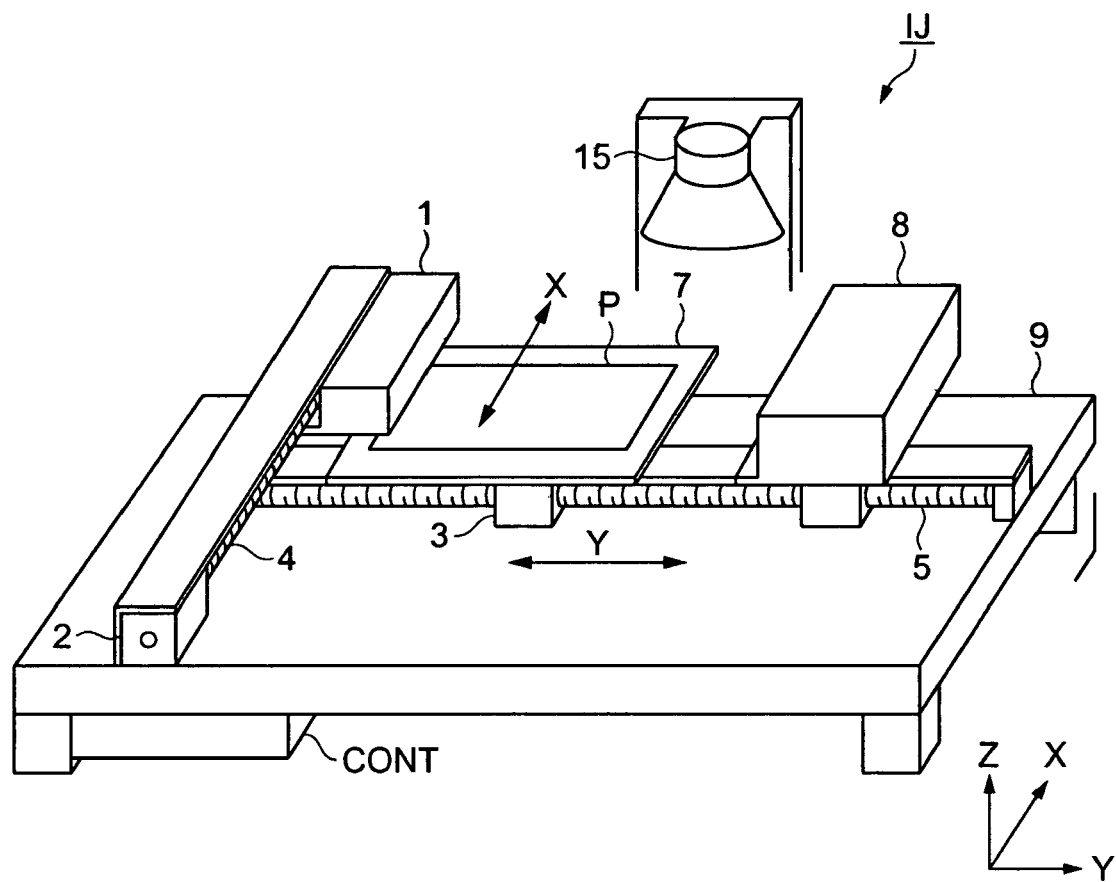
FIG. 1 is a schematic oblique diagram of a droplet discharge system.

Embodiments of a thin film pattern substrate and a method for manufacturing a device of the invention will now be described in detail with reference to the drawings. The embodiments are described using an example of forming, on a substrate, a wiring pattern composed of a conductive film by discharging, as a droplet, a wiring pattern (a film pattern) forming ink (a functional liquid) that includes a conductive microparticle from a discharge nozzle of a droplet discharge head by using a droplet discharge method.

First Embodiment

First, an ink to be used (a functional liquid) is described. A wiring pattern forming ink, which is a liquid material, is composed of a dispersion liquid that is made by dispersing conductive microparticles into a dispersion medium. In the embodiment, in addition, for example, to metal microparticles that contain at least any one of gold, silver, copper, aluminum, palladium, or nickel, oxides of these microparticles, and microparticles of conductive polymer or superconducting property are used as a conductive microparticle. The surface of the conductive microparticle can be coated with organic matters or the like for the purpose of improving the dispersibility. It is preferable that the diameter of the conductive microparticle is between 1 nm to 1.0 µm. This is because a particle that is greater than 1.0 µm in diameter could cause the discharge nozzle of the droplet discharge head (to be described later) to be clogged. In the meanwhile, a particle that is smaller than 1 nm in diameter means a large volume proportion of the coating material to the conductive microparticle, causing an excessively large proportion of the organic matters in the resulting film.

Dispersion media to be used are not particularly limited, as long as the above-mentioned conductive microparticles can be dispersed without causing coagulation. In addition to water, alcohols such as methanol, ethanol, propanol, and butanol, hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene, ethers compounds such as ethylene glycol dimethyl ether, ethylene glycol diethyl ether, ethylene glycol methyl ethyl ether, diethyleneglycol dimethyl ether, diethylene glycol diethyl ether, diethylene glycol methyl ethyl ether, 1,2-dimethoxyethane, Bis (2-methoxyethyl) ether, and p-dioxane, and polar compounds such as propylene carbonate, gamma-butyrolactone, N-methyl-2-pyrrolidone, dimethylformamide, dimethyl sulfoxide, and cyclohexanone are acceptable. Among these, water, alcohols, hydrocarbon compounds, and ethers compounds are preferable in terms of the dispersibility of particles, the stability of dispersion liquid, and the applicability to a droplet discharge method. In particular, water and hydrocarbon compounds are more preferable as a dispersion medium.

It is preferable that the surface tension of the dispersion liquid for the conductive microparticles is between 0.02 N/m to 0.07 N/m. This is because when the surface tension is smaller than 0.02 N/m in the discharging of a droplet by using a droplet discharge method, the wetting property of the ink toward the nozzle surface increases and induces jet deflection, while when the surface tension is greater than 0.07 N/m, the form of the meniscus on the top of the nozzle is unstable and makes it difficult to control the rate and the timing of discharging. To adjust the surface tension, it is preferable that a minute amount of surface tension regulants, such as fluorine-containing ones, silicon-containing ones, and nonion-containing ones, may be added to the dispersion liquid within the limits of not lowering unreasonably the contact angle with the substrate. Nonion-containing surface tension regulants improve the wetting property of an ink toward a substrate and the leveling of a film, and is effective in preventing occurrences of minute unevenness and the like on the film. The surface tension regulants may, if necessary, include organic compounds, such as alcohol, ether, ester, and ketone.

It is preferable that the viscosity of the dispersion medium is between 1 mPa·s to 50 mPa·s. This is because when the viscosity is smaller than 1 mPa·s in the discharging of an ink as a droplet by using a droplet discharge method, the peripheral part of a nozzle is easily polluted with the ink flowage, while when the viscosity is greater than 50 mPa·s the nozzle aperture is more frequently clogged, making it difficult to discharge a droplet smoothly.

As a substrate on which a wiring pattern to be formed, such as glass, quartz glass, Si wafer, plastic film, metal plate, ceramic and the like can be used. In addition, substrates made of these various material can be used also with layers, such as a semiconductor film, a metal film, a dielectric film, an organic film, an insulating film or the like formed on its surface as a base layer.

Here, discharging technologies for a droplet discharge method include an electrification control method, a pressure vibration method, an electromechanical transducing method, an electrothermal transducing method, an electrostatic suction method and the like. The electrification control method is a method of discharging a material from a discharge nozzle while giving charge on a material with a charging electrode and controlling the flight direction of the material with a deflection electrode. The pressure vibration method is a method of discharging a material from a nozzle edge by applying ultra-high pressure, such as around 30 kg/cm2, on the material, wherein the material is discharged straight, from the discharge nozzle in the case where no control pressure is applied, while, in the case where control pressure is applied, the material is not discharged from the discharge nozzle because the control pressure induces an electrostatic resilience within the material, causing the material to shatter. The electromechanical transducing method is a method that uses a property of a piezo element (a piezoelectric element) of transforming in response to pulse-like electrical signals, wherein the transformed piezo element gives pressure, via a flexible material, into the space where the material is stored, pushing out the material from the space to be discharged through the discharge nozzle.

The electrothermal transducing method is a method that uses a heater, set up in the space where a material is stored, to rapidly vaporize the material for generating bubbles so that the pressure of which induces the material in the space to be discharged. The electrostatic suction method is a method that adds small pressure into the space where a material is stored to form a meniscus of the material on the discharge nozzle, drawing out the material by adding electrostatic attraction in this state of things. In addition of these methods, technologies, such as a method of using the change of liquid viscosity according to the electric field and a method of flicking a material by using discharge spark, are also applicable. Droplet discharge methods have an advantage that a material can be used without much waste and a desired amount of material can be accurately placed on a desired position. The amount of a droplet of a liquid material to be discharged using a droplet discharge method is, for example, between of 1 to 300 nanogram.

Next, a device manufacturing system that is used for manufacturing a device according to an aspect of the invention will be described. As a device manufacturing system, a droplet discharge device (an ink jet device) for manufacturing devices by discharging (dropping) a droplet onto a substrate from a droplet discharge head is used.

FIG. 1 is an oblique diagram showing a schematic configuration of a droplet discharge device IJ.

In FIG. 1, the droplet discharge device IJ includes a droplet discharge head 1, an X-axis direction drive shaft 4, a Y-axis direction guide shaft 5, a control system CONT, a stage 7, a cleaning mechanism 8, a pedestal 9, and a heater 15.

The stage 7 holds up a substrate P on which an ink to be placed by the droplet discharge device IJ, having a fixing mechanism (not shown) to fix the substrate P onto a reference position.

The droplet discharge head 1 is a multi-nozzle type, having a plurality of discharge nozzles, and is placed in line along its longitudinal direction in the X-axis direction. The plural discharge nozzles are placed on the under surface of the droplet discharge head 1 along the X-axis direction at certain intervals. An ink containing the above-mentioned conductive microparticles is discharged from the discharge nozzles of the droplet discharge head 1 onto the substrate P that is held up on the stage 7.

An X-axis direction drive motor 2 is connected to the X-axis direction drive shaft 4. The X-axis direction drive motor 2 is a stepping motor or the like that rotates the X-axis direction drive shaft 4 when a driving signal in the X-axis direction is supplied from the control system CONT. The droplet discharge head 1 moves into the X-axis direction when the X-axis direction drive shaft 4 rotates.

The Y-axis direction guide shaft 5 is fixed on the pedestal 9 to be immobilized. The stage 7 includes a Y-axis direction drive motor 3. The Y-axis direction drive motor 3 is a stepping motor or the like that moves the stage 7 in the Y-axis direction when a driving signal in the Y-axis direction is supplied from the control system CONT.

The control system CONT supplies the droplet discharge head 1 with voltage for controlling the droplet discharging. Further, the control system CONT supplies the X-axis direction drive motor 2 with a driving pulse signal for controlling the transfer of the droplet discharge head 1 in the X-axis direction, in addition to supplying the Y-axis direction drive motor 3 with a driving pulse signal for controlling the transfer of the stage 7 in the Y-axis direction.

The cleaning mechanism 8, having a Y-axis direction drive motor (not shown), cleans the droplet discharge head 1. The cleaning mechanism 8 moves along the Y-axis direction guide shaft 5 driven by the Y-axis direction drive motor. The transfer of the cleaning mechanism 8 is also controlled by the control system CONT.

Here, the heater 15 carries out heat treatment on the substrate P with a lamp anneal to evaporate and dry the solvent that is included in the ink applied on the substrate P. The applying and blocking of power on the heater 15 is also controlled by the control system CONT.

The droplet discharge device IJ discharges a droplet onto the substrate P while relatively scanning the droplet discharge head 1 and the stage 7 that holds up the substrate P. Here, in the following explanation, the Y-axis direction is referred to as a scan direction while the X-axis direction that is orthogonal to the Y-axis direction is referred to as a non-scan direction. Therefore, the discharge nozzles of the droplet discharge head 1 are placed along the X-axis direction, which is a non-scan direction, at certain intervals. Further, although the droplet discharge head 1 is placed perpendicular to the moving direction of the substrate P in FIG. 1, the head can be also placed to intersect the moving direction of the substrate P by controlling the angle of the droplet discharge head 1. Thus, the pitch between the nozzles can be adjusted by controlling the angle of the droplet discharge head 1. It is also acceptable to make the distance between the substrate P and the nozzle surface optionally adjustable.

Figure 2:
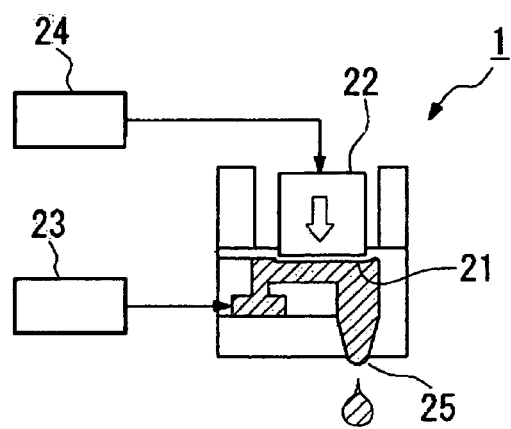
FIG. 2 is a diagram explaining a principle for discharging a liquid material by the piezo method.

FIG. 2 is a diagram for explaining the principle to discharge a liquid material by using a piezo method.

In FIG. 2, a piezo element 22 is placed adjacently to a liquid space 21 in which a liquid material (a wiring pattern forming ink, or a functional liquid) to be accommodated. In the liquid space 21, a liquid material is supplied via a liquid material supply system 23 that includes a material tank in which a liquid material to be accommodated. The piezo element 22 is connected to a drive circuit 24. The liquid space 21 is transformed due to the transformation of the piezo element 22 when voltage is applied onto the piezo element 22 via the drive circuit 24, causing a liquid material to be discharged from a discharge nozzle 25. In this case, the deformative amount of the piezo element 22 is controlled by changing the amount of the voltage to be applied. The deformative speed of the piezo element 22 is controlled by changing the frequency of the voltage to be applied. The droplet discharge using a piezo method has an advantage of having a little effect on the composition of the materials, as no heat is applied to the materials.

Next, an embodiment of a wiring pattern forming method of the invention will be described with reference to FIGS. 3, 4, and 5.

Figure 3:
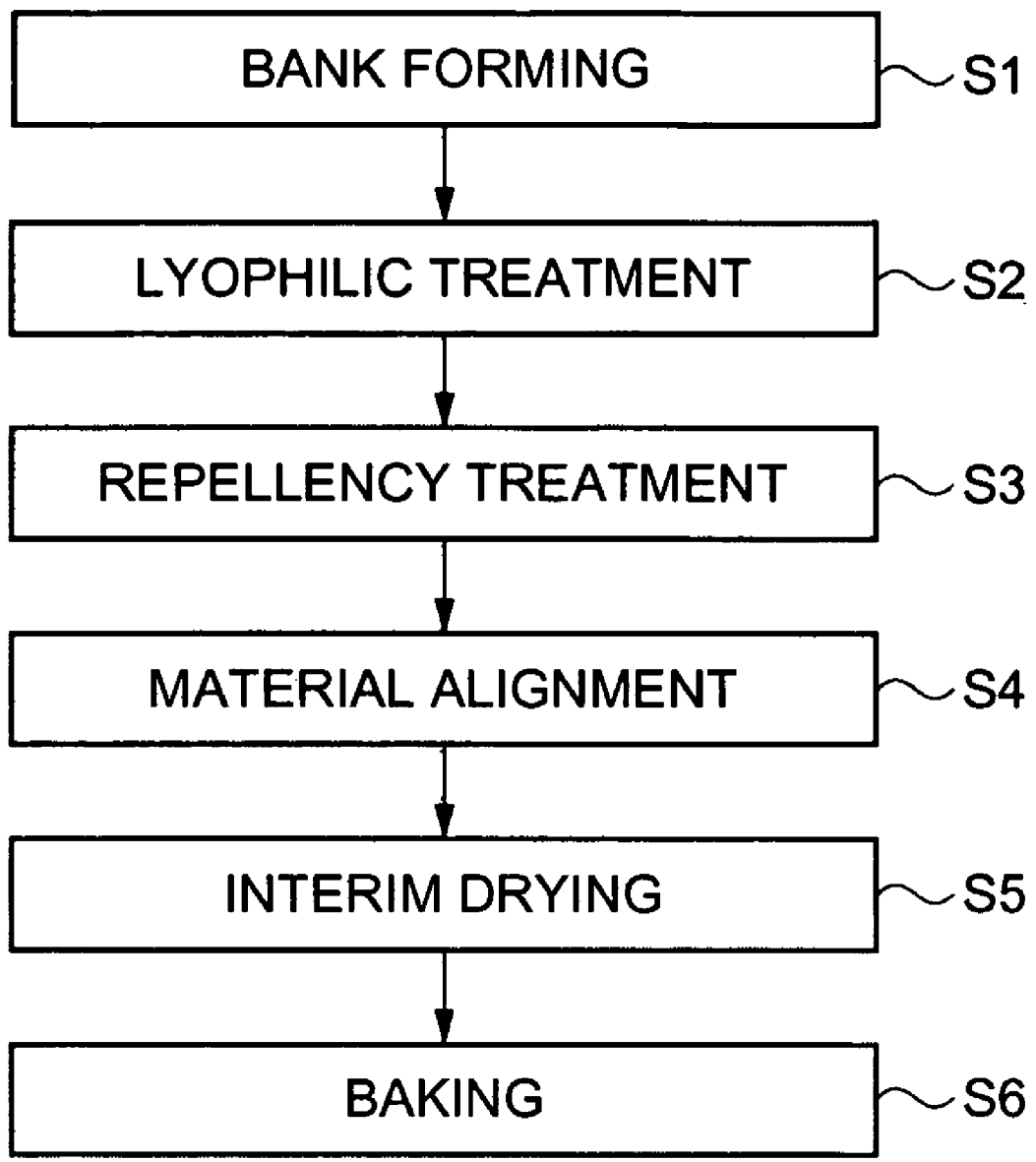
FIG. 3 is a flowchart showing a thin film pattern forming method.

FIG. 3 is a flowchart showing an example of a wiring pattern forming method according to the embodiment. FIGS. 4 and 5 are pattern diagrams showing a forming procedure.

As shown in FIG. 3, in a wiring pattern forming method according to the embodiment, a droplet of the above-mentioned ink (a functional liquid) is discharged onto a substrate to form (draw) a conductive film wiring pattern on the substrate. The method includes: a bank forming step S1 for forming a protruding bank on a substrate according to a wiring pattern, a lyophilic treatment step S2 for adding a lyophilic property onto the substrate, a repellency treatment step S3 for adding repellency to the bank, a material alignment step S4 for aligning an ink between the banks to which repellency has been added, an interim drying step S5 for removing at least a part of the liquid component of the ink, and a baking step S6. Now, each step will be described in detail. In the embodiment, a glass substrate is used as a substrate P.

Bank Forming Step

Figure 4A:
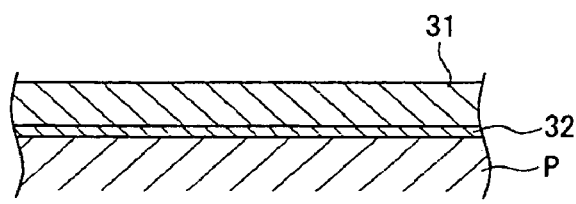
FIGS. 4A, 4B and 4C are pattern diagrams showing a thin film pattern forming procedure.

First, as a surface reforming treatment before the applying of an organic material, HMDS processing is carried out onto the substrate P. HMDS processing is a method of applying hexamethyl disilazane ((CH3)3SiNHSi(CH3)3) in a state of steam. Thus, as shown in FIG. 4A, an HMDS layer 32 is formed on the substrate P as an adhesion layer for improving the adhesiveness between the bank and the substrate P.

Figure 4B:
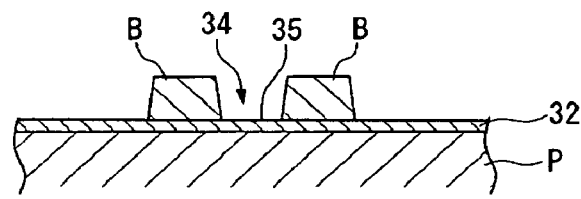

The bank is an item that works as a partition, and can be formed using any of given methods, such as photolithography or printing methods. In the case of using photolithography, for example, an organic photosensitive material 31 is applied on the HMDS layer 32 on the substrate in conformity to the height of the bank, using any of given methods, such as a spin coat, a spray coat, a roll coat, a die coat, and a dip coat. Then, a resist layer is applied on top of that. Next, the resist is exposed and developed with a mask that conforms to the shape of the bank (the wiring pattern) to leave behind the resist in the shape of the bank. Finally, the bank material remaining on the part other than the mask is removed by etching. The bank (the convex part) can be also formed with a plurality of layers, with the lower layer composed of an inorganic matter and the upper layer composed of an organic matter. Thus, as shown in FIG. 4B, the banks B and B are formed protrudently in a manner of enclosing the periphery of the area on which a wiring pattern to be formed. It is preferable that the banks B and B are formed in a tapered shape, the width on the upper part being narrower than the width on the bottom part, so that a droplet of an ink is easy to flow into the groove between the banks, as is described later.

As an organic material for forming a bank, materials that have liquid repellency against an ink can be used. In addition, insulating organic materials that can take on liquid repellency (be fluorinated) by a plasma processing and has good adhesiveness to the base substrate and can be easily patterned by using photolithography, as is described later, can also be used. For example, polymeric materials, such as acrylic resin, polyimide resin, olefin resin, phenolic resin, and melamine resin, can be used. Materials having an organic group with an inorganic structure (siloxane bond) in a main chain can also be used.

Figure 4C:
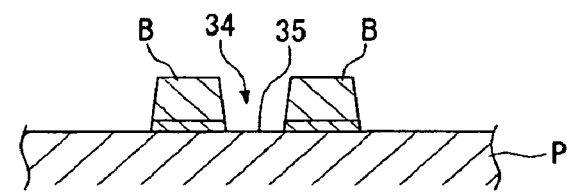

A hydrofluoric acid processing is carried out after the banks B and B are formed on the substrate P. A hydrofluoric acid processing is a process of removing the HMDS layer 32 between the banks B and B by carrying out etching using, for example, a hydrofluoric water solution with a 2.5 percent concentration. In a hydrofluoric processing, the banks B and B work as a mask, removing the HMDS layer 32, which is an organic matter located on the bottom part 35 of the groove 34 that is formed between the banks B and B, and then revealing the substrate P, as shown in FIG. 4C.

Lyophilic Treatment Step

Next, a lyophilic treatment for adding a lyophilic property onto the bottom part 35 between the banks B and B (the revealed part on the substrate P) is carried out. As lyophilic treatment steps, there are ultraviolet (UV) light irradiation processing of irradiating ultraviolet light, O2 plasma processing of using oxygen as a processing gas in the atmospheric air, and the like. Here, the O2 plasma processing is carried out.

In the O2 plasma processing, oxygen in the plasma state is irradiated onto the substrate P from a plasma ignition electrode. As an example of the conditions for the O2 plasma processing, the plasma power, for example, may be between 50 W to 1000 W, the oxygen gas flow volume may be between 50 mL/min to 100 mL/min, the relative moving speed of the substrate to the plasma ignition electrode may be between 0.5 mm/sec to 10 mm/sec, and the substrate temperature may be between 70 to 90 degrees centigrade.

In the case where the substrate P is a glass substrate, the surface has already a lyophilic property to the wiring pattern forming ink. But the lyophilic property of the surface of the substrate P revealed between the banks B and B (the bottom part 35) can be further improved by carrying out the O2 plasma processing or the ultraviolet light irradiation processing or the like, as in the embodiment. Here, it is preferable that the O2 plasma processing or the ultraviolet light irradiation processing is carried out so that the contact angle toward the ink on the bottom part 35 between the banks becomes smaller than 15 degrees.

Figure 9:
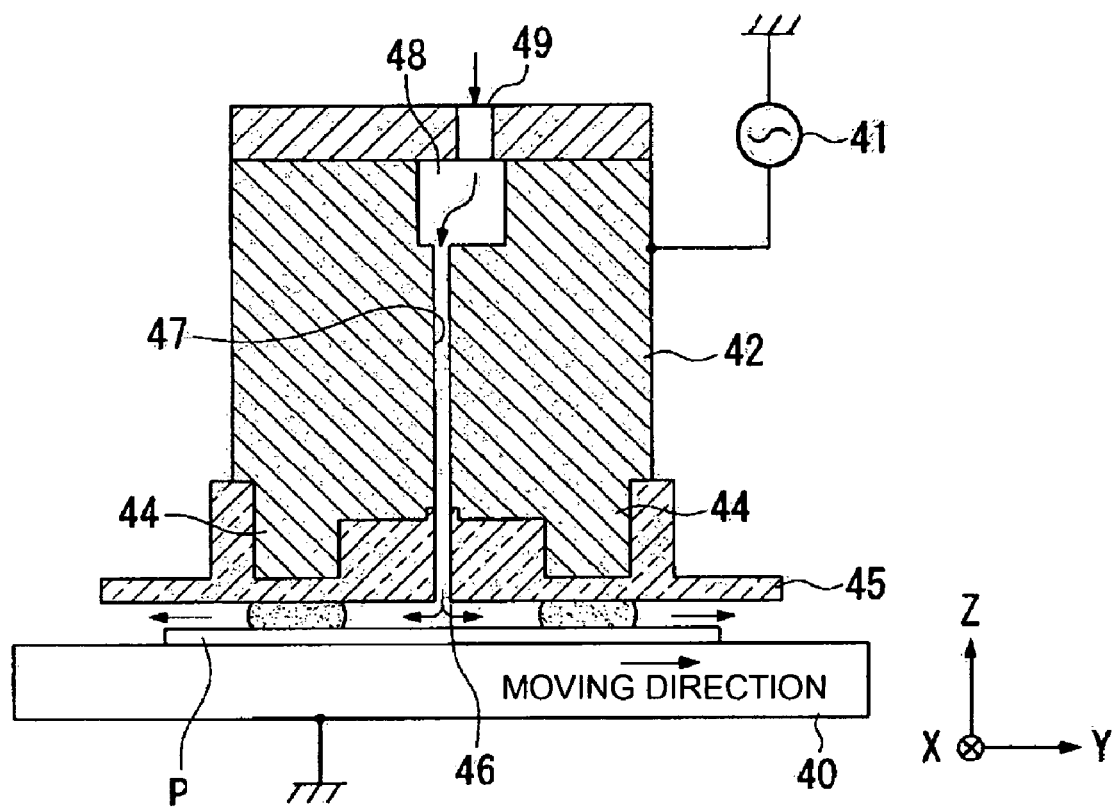
FIG. 9 is a diagram showing an example of a plasma processing apparatus used in the processing of propellant fouling.

FIG. 9 is a diagram schematically showing an example of a plasma processing apparatus to be used in the O2 plasma processing. The plasma processing apparatus shown in FIG. 9 includes an electrode 42 that is connected to an alternator 41, and a sample table 40, which is an earth electrode. The sample table 40 is able to move in the Y-axis direction while holding up a substrate P, which is a sample. On the under surface of the electrode 42, two parallel electric discharge generating parts 44 and 44 that outlie in the X-axis direction, which is orthogonal to the moving direction, are formed protrudently. A dielectric item 45 is placed in a manner of enclosing the electric discharge generating parts 44 to prevent abnormal electric discharge on the electric discharge generating parts 44. The under surface of the electrode 42 including the dielectric item 45 is almost planate, letting a slight space (a discharge gap) to be formed between the substrate P and the electric discharge generating parts 44 and the dielectric item 45. Further, a gas spout 46 forming a part of the processing gas supply part that is formed slenderly in the X-axis direction is set up on the center of the electrode 42. The gas spout 46 is connected to a gas lead-in 49 through a gas passage 47 and an intermediate chamber 48 within the electrode.

A given gas, which includes a processing gas discharged from the gas spout 46 after passing through the gas passage 47, flows out both forwards and backwards in the moving direction (in the Y-axis direction) within the space to be exhausted outside from the forward end and the back end of the dielectric item 45. Concurrently with this, a predetermined voltage is applied from the alternator 41 to the electrode 42, inducing gaseous discharge to be generated between the electric discharge generating parts 44 and 44 and the sample table 40. Then, excitation activated species of the given gas are generated by the plasma that is generated by the gaseous discharge, letting the entire surface of the substrate P that passes through the discharge area to be successively processed.

In the embodiment, the given gas is a mixture of oxygen (O2), which is a processing gas, and rare gasses, such as helium (He) and argon (Ar), for easily starting electric discharge under the pressure in the proximity of the atmospheric pressure and maintaining it stably, and inert gases such as nitrogen (N2). In particular, by using oxygen as a processing gas, the fouling of organic matters (resist, HMDS, or the like) that is left on the bottom part 35 between the banks in their forming can be removed. Specifically, HMDS (an organic matter) on the bottom part 35 between the banks B and B is not necessarily removed completely in the above-mentioned hydrofluoric acid processing. There is also a case that the resist (an organic matter) in the bank forming remains on the bottom part 35 between the banks B and B. Thus, the fouling on the bottom part 35 between the banks B and B is removed by carrying out the O2 plasma processing.

Although the HMDS layer 32 is removed by carrying out the hydrofluoric acid processing in the above explanation, the hydrofluoric acid processing does not need to be carried out because the HMDS layer 32 on the bottom part 35 between the banks can be sufficiently removed by the O2 plasma processing or the ultraviolet light irradiation processing. Further, although either of the O2 plasma processing or the ultraviolet light irradiation processing is carried out as a lyophilic treatment in the above explanation, the O2 plasma processing and the ultraviolet light irradiation processing can be also combined.

Repellency Treatment Step

Next, a repellency treatment is carried out onto the banks B to add repellency to the surface. As a repellency treatment, a plasma processing method (CF4 plasma processing method) that uses carbon tetrafluoride (tetrafluoromethane) as a processing gas is used. As a condition for the CF4 plasma processing, the plasma power, for example, may be between 50 W to 1000 W, the carbon tetrafluoride gas flow volume may be between 50 mL/min to 100 mL/min, the substrate transferring speed to the plasma ignition electrode may be between 0.5 mm/sec to 20 mm/sec, and the substrate temperature may be between 70 to 90 degrees centigrade. As a processing gas, not only tetrafluoromethane but also other fluorocarbon gases, or other gases such as SF6 and AF5CF3 can be used. For the CF4 plasma processing, a plasma processing apparatus described with reference to FIG. 9 can be used.

By carrying out the repellency treatment, fluorine radical is put into the resin that constitutes the banks B and B, adding high repellency to the banks B and B. Further, although the above-mentioned O2 plasma processing as a repellency treatment can be also carried out before the forming of the banks B, it is preferable that the O2 plasma processing is carried out after the forming of the banks B, because acrylic resin and polyimide resin and the like has a property of being more easily fluorinated (added repellency) after the O2 plasma processing has been carried out.

Here, although the repellency treatment toward the banks B and B has an effect to a certain degree on the exposed part of the substrate P between the banks on which the repellency treatment has been carried out before, the repellency, or the wetting property, of the substrate P is not practically damaged because fluorine radical is not put into by the repellency treatment, especially when the substrate P is composed of glass or the like.

By the above-mentioned lyophilic treatment step and repellency treatment step, a surface improving process for making the repellency of the banks B higher than the repellency of the bottom part 35 between the banks is completed. Here, although the O2 plasma processing is carried out as a lyophilic treatment, the repellency of the banks B can be made higher than the repellency of the bottom part 35 between the banks also by carrying out only the CF4 plasma processing without carrying out the O2 plasma processing, because fluorine radical is not put into by the repellency treatment when the substrate P is composed of glass or the like, as is described above.

Material Alignment Step

Figure 5A:
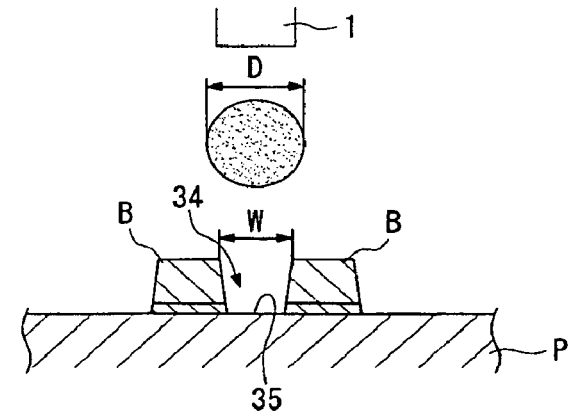
FIGS. 5A, 5B and 5C are pattern diagrams showing a thin film pattern forming procedure.

Next, a droplet of a wiring pattern forming ink is placed on the substrate P between the banks B and B by using a droplet discharge method of the droplet discharge device IJ. Here, an organic silver compound is used as a conductive material, and an ink composed of organic silver compounds that uses a diethylene glycol diethyl ether as a solvent (a dispersion medium) is discharged. In the material alignment step, as shown in FIG. 5A, an ink including a wiring pattern forming material is discharged as a droplet from a droplet discharge head 1. The droplet discharge head 1 discharges a droplet of the ink into the groove 34 between the banks B and B to align the ink in the groove 34. Here, the droplet is prevented from spreading out to the part other than the predetermined position, because the wiring pattern forming area (or the groove 34) onto which the droplet to be discharged is surrounded by the banks B and B.

In the embodiment, the width W of the groove 34 between the banks B and B (here, the width of the groove 34 at the orifice) is set to be smaller than the diameter D of the droplet of the ink (functional liquid). It is preferable that the temperature and the humidity of the atmosphere with which a droplet to be discharged are set to be lower than or equal to 60 degrees centigrade and lower than or equal to 80 percent, respectively. Thus, a stable droplet discharging can be carried out without causing the discharge nozzles of the droplet discharge head 1 to be clogged.

Figure 5B:
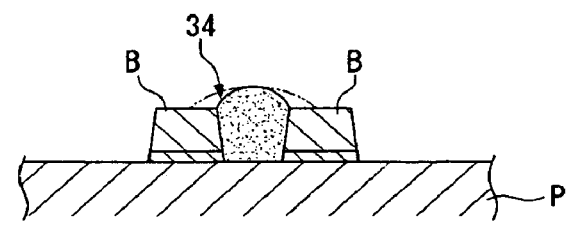

When the droplet is discharged from the droplet discharge head 1 to be placed in the groove 34, a part of the droplet mounts on the banks B and B as shown in FIG. 5B with the chain double-dashed line, because the diameter D of the droplet is bigger than the width W of the groove 34. However, because the surface of the banks B and B has repellency and the groove is in a tapered shape, the part of the droplet that mounts on the banks B and B is repelled from the banks B and B and runs down into the groove 34 due to capillary phenomenon, letting the droplet get inside the groove 34 as shown in FIG. 5B with the solid line.

Further, the ink that is discharged into the groove 34 or that is run down from the banks B and B is easy to spread out wettingly, because a lyophilic treatment is carried out on the substrate P (the bottom part 35), letting the ink infill the groove 34 more evenly. Therefore, the droplet that is discharged into the groove 34 flows well into the groove 34 and infills the groove evenly, despite of the fact that the width W of the groove 34 is smaller than the diameter D of the droplet.

Interim Drying Step

Figure 5C:
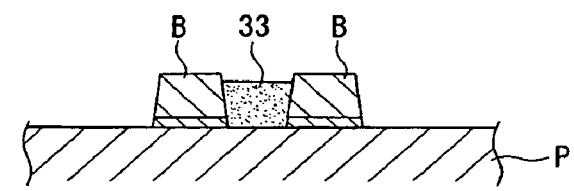

After discharging the droplet onto the substrate P, a drying process is carried out, if necessary, for removing the dispersion medium and for assuring the film thickness. The drying process can be carried out not only by using, for example, an ordinary hot plate or an electric furnace for heating the substrate P but also by using a lamp anneal. As a light source to be used for a lamp anneal, although it is not limited particularly, infrared lamp, xenon lamp, YAG laser, argon laser, carbon dioxide laser, and excimer laser such as XeF, XeCl, XeBr, KrF, KrCl, ArF, and ArCl can be used. Although these light sources are generally used with the output power between 10 W to 5000 W, the range between 100 W to 1000 W is sufficient for the present embodiment. Thus, by repeating the interim drying step and the material alignment step, a plurality of layers of the droplet of the ink is formed by lamination, as shown in FIG. 5C, to eventually form a wiring pattern (a thin film pattern) 33 with a thick film.

Baking Step

The dried film after the discharging step, in the case where it is an organic silver compound, needs heat treatment to get conductivity, removing the organic element from the organic silver compound while leaving the silver particles behind. Therefore, heat treatment and/or light treatment is carried out onto the substrate after the discharging step.

Although heat treatment and/or light treatment is usually carried out in the ordinary air, it can also be done, if necessary, in inert gases atmosphere, such as nitrogen, argon, and helium, as well as in reduced atmosphere, such as hydrogen. The temperature with which heat treatment and/or light treatment is done is decided according to the boiling point (steam pressure) of the dispersion medium, the type and the pressure of the atmosphere gas, thermal behaviors of the particles, such as dispersibility and oxidativity, the presence and the amount of the coating material, and the heat resistance of the substrate. In the embodiment, a baking step is carried out on the ink that has formed a pattern after being discharged, at a temperature between 280 to 300 degrees centigrade for 300 minutes with a clean oven in the atmosphere. To remove the organic element from the organic silver compound, the baking needs to be carried out at about 200 degrees centigrade. In the case of using a substrate made of plastic or the like, it is preferable that the baking is carried out at a temperature that is higher than room temperature and lower than or equal to 250 degrees centigrade. Thus, the dried film after the discharging step is converted to a conductive film, as electric contact is assured among the particles through these steps.

After the baking step, the banks B and B on the substrate P can be removed with ashing exfoliation treatment. As ashing exfoliation treatment, plasma ashing, ozone ashing, or the like can be adopted. Plasma ashing makes plasma gases, such as oxygen gas, and the banks (resist) to react, vaporizing the banks for exfoliation and removal. The banks are solid matters composed of carbon, oxygen, and hydrogen, which transform into $CO_2$, $H_2O$, and $O_2$ after a chemical reaction with oxygen plasma, making it possible to exfoliate all as gas. In the meantime, the basic principle of ozone ashing is the same with that of plasma ashing, wherein O3 (ozone) is decomposed and transformed into O+ (oxygen radical), which is reactive gas, to make the O+ and the banks to react to each other. The banks which have reacted to the O+ transform into $CO_2$, $H_2O$, and $O_2$, and are all exfoliated as gas. By carrying out an ashing exfoliation process onto the substrate P, the banks are removed from the substrate P. As a process for removing the banks, a method of melting the banks into solvent or a method of physically removing them can be used, in addition to the ashing exfoliation process.

Now, a method for forming a film pattern substrate as a first embodiment of the invention will be described.

Figure 6A:
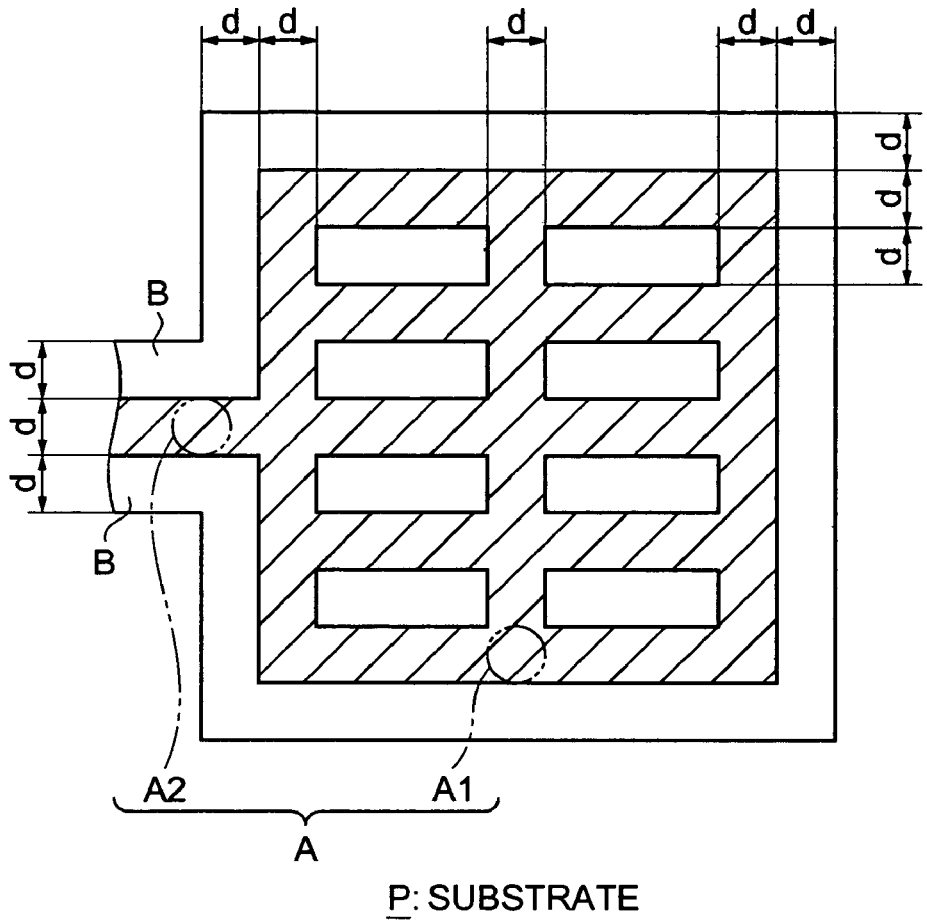
FIGS. 6A, 6B and 6C are pattern diagrams showing a thin film pattern substrate as a first embodiment, FIG. 6A being a two-dimensional diagram, FIG. 6B being a diagram showing a shape of a functional liquid L, and FIG. 6C being a sectional view of a droplet.
Figure 6B:
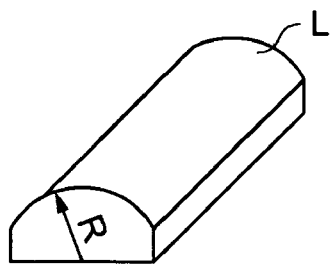
Figure 6C:
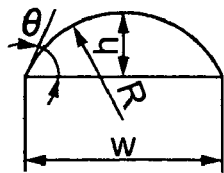

FIGS. 6A, 6B and 6C are pattern diagram showing a thin film pattern substrate as a first embodiment, FIG. 6A being a two-dimensional diagram, FIG. 6B being a diagram showing the shape of a functional liquid L, and FIG. 6C being a sectional view of a droplet.

As shown in FIG. 6A, in the forming of the banks B on the substrate P, a film pattern is configured in a manner that a first area A1 is formed subdividedly in a lattice on a striated area A that is comparted with the banks B, and that the line width d of the first area A1 and the line width d of a second area A2 are equal.

The banks B are formed on the substrate P, and are configured in a manner that a functional liquid L can be placed onto the striated area A that is comparted by the banks B. Specifically, the banks B are configured in a manner that the functional liquid L that is infused, by discharging, from the nozzles of the droplet discharge head 1 into the first area A1 flows from the first area A1 toward the second area A2.

In the film pattern forming method, the functional liquid L efficiently flows from the first area A1 toward the second area A2 because the line width d of the striated area A comparted with the banks B is formed uniformly. Further, by successively dropping the functional liquid L onto the first area A1, the functional liquid L that stays on the first area A1 gradually mantles, inducing the functional liquid L to gradually flow from the first area A1 toward the second area A2. The functional liquid L that is flown into the second area A2 stays on the second area A2.

Here, the functional liquid L is placed on the striated area A that is comparted with the banks B, and a striated film pattern F is formed on the substrate P by, for example, drying the functional liquid L. In such a case, as the shape of the film pattern F is defined by the banks B, the film pattern F can be formed more minutely and with thinner lines by appropriately forming the banks B by means, for example, of making the width between the adjacent banks B and B narrower. Further, it is also acceptable to form banks only for the peripheral part of the first area A1, processing the surface of the inside area for the island-shaped banks, instead, with a repellency treatment.

Generally, in placing liquid matter on the striated area A, there are cases that the liquid matter is difficult to influx into the area or to spread out within the area due to influences, such as surface tension of the liquid matter. Meanwhile, in the film pattern substrate forming method of the invention, the pressure on the first area A1 and the pressure on the second area A2 are almost constant because the line width is formed uniformly, which stabilizes the movement of the liquid matter on this part and encourages the influx of the functional liquid L into the striated area A or the spreading out of the functional liquid L within the striated area A.

The influx of the functional liquid L from the first area A1 toward the second area A2 is, thus, encouraged in the placing of the functional liquid L. Therefore, a film pattern F can be formed in a desired shape because troubles, such as the running down of an ink on the second area A2, can be prevented. Thus, a film pattern F having thin lines can be formed precisely and stably.

Now, how the pressure P1 on the first area A1 and the pressure P2 on the second area A2 become almost constant will be described with reference to FIG. 6B.

When the functional liquid L is dropped onto the first area A1, the functional liquid L becomes semispherical due to the power of the surface tension to stabilize. However, when the functional liquid L is dropped successively onto the first area A1, the functional liquid L gradually increases and starts to flow into the second area A2 from the first area A1 along a groove that is formed in a lattice on the striated area A. When the dropping of a predetermined amount of functional liquid L is completed, the shape of the functional liquid L1 dropped onto the first area A1 and the shape of the functional liquid L2 on the second area A2 become almost hog-backed because the first area A1 and the second area A2 are thinly grooved, which equalizes and stabilizes the pressure P1 on the first area A1 and the pressure P2 on the second area A2 (refer to FIG. 6B).

Here, when the width of the first area A1 and the second area A2 is defined as d, the pressure of the functional liquid L1 that is dropped onto the first area A1 as P1, the surface tension as σ, the liquid level curvature radius as R1, and the longitudinal curvature radius as R3, the R3 is ∞, and the following relation is realized between P1, σ, and R1, and the pressure P1 of the functional liquid L1 that is dropped onto the first area A1 is expressed by the Equation 1, with σ referring to the surface tension.

Equation 1

$$P_1 = \sigma\left(\frac{1}{R_1} + \frac{1}{R_3}\right) = \frac{\sigma}{R_1} \tag{1}$$

Next, when the pressure of the functional liquid L2 on the second area A2 is defined as P2, the surface tension as σ, the cross direction curvature radius as R2, and the longitudinal curvature radius as R3, the R3 is ∞, and the following relation is realized between P2, σ, and R2, and the pressure P2 on the second area A2 is expressed by the Equation 2, with σ referring to the surface tension.

Equation 2

$$P_2 = \sigma\left(\frac{1}{R_2} + \frac{1}{R_3}\right) = \frac{\sigma}{R_2} \tag{2}$$

However, R1 equals R2 because the width d is the same in the first area A1 and in the second area A2, and P1 equals P2 according to Equations 1 and 2. Specifically, the pressure P1 of the functional liquid L1 on the first area A1 and the pressure P2 of the functional liquid L2 on the second area A2 become equal and are in balance in the static state.

Here, the height h of the curvature of the first area A1 and of the second area A2 will be described with reference to FIG. 6C.

When the curvature radius of the droplet L is defined as R, the height of the curvature as h, and the width of the base part as w, as shown in FIG. 6C, the height of the curvature h is expressed by Equation 3.

Equation 3

$$h = R\left(1 - \sqrt{1 - \left(\frac{w}{2R}\right)^2}\right) \tag{3}$$

Here, when the curvature radius of the functional liquid L1 that is dropped on the first area A1 is defined as R1, the height of the curvature as h1, and the width of the base part as w, the height of the curvature h1 is expressed by Equation 4.

Equation 4

$$h_1 = R_1\left(1 - \sqrt{1 - \left(\frac{w}{2R_1}\right)^2}\right) \tag{4}$$

In the same way, when the curvature radius of the functional liquid L2 that is dropped on the second area A2 is defined as R2, the height of the curvature as h2, and the width of the base part as w, the height of the curvature h2 is expressed by Equation 5.

Equation 5

$$h_2 = R_2\left(1 - \sqrt{1 - \left(\frac{w}{2R_2}\right)^2}\right) \tag{5}$$

Here, R1 equals R2 because the line width d is the same in the first area A1 and in the second area A2, and h1 equals h2 according to Equations 4 and 5. Thus, the film thickness on the first area A1 and on the second area A2 eventually equal after being dried.

In the above-mentioned first embodiment, the following effects can be achieved.

1. The height of the curvature h of the dropped droplet L is almost equal within the first area A1, because the striated area A has a linear pattern on the first area A1 that is made up with thin (narrow) lines. Therefore, the film thickness is uniform after the droplet L is dried, and a film pattern with minimal unevenness can be formed. Further, when an ink is discharged on a wide drawing area, there is a possibility that the ink may run short due to the absorption. However, when the wide drawing area is comparted by the first area A1 that is made up with thin (narrow) lines, the ink flows more easily along the narrow (thin) first area A1, preventing the ink from being run short. Thus, a thin film pattern with minimal defect can be formed.

2. The uniformity of the line width d of the first area A1 on the striated area A and the line width d of the groove forming the pattern on the second area A2 equals the pressure P1 of the functional liquid L1 on the first area A1 and the pressure P2 of the functional liquid L2 on the second area A2, letting the functional liquid L infused into the first area A1 to effectively flow into the second area A2. Specifically, a film pattern can be formed with a minimum amount of droplets, and a finer film pattern can be formed.

3. Further, because the line width d of the first area A1 and of the second area A2 are equal, the evaporation rate of the dispersion medium contained in the functional liquid L that is dropped on the line width d forming the pattern become almost equal on the first area A1 and on the second area A2.

Thus, the uniformity of the film can be easily achieved in the drying process. Specifically, a film pattern with minimal unevenness can be formed because the film thickness on the first area A1 and that on the second area A2 are almost equal. Thus, a flat and uniform lamination film can be formed also in the case where a lamination film in a lamination structure is generated by laminating other films on this film pattern, and eventually a device with stable quality having no break or the like can be provided.

Second Embodiment

Next, a second embodiment of the invention will be described. The second embodiment is different from the first embodiment in that the liquid infusing part A2 is pectinate. Here, the same symbols are used for the same components and the components having the same features as those in the first embodiment, the explanations for which are not given.

Figure 7:
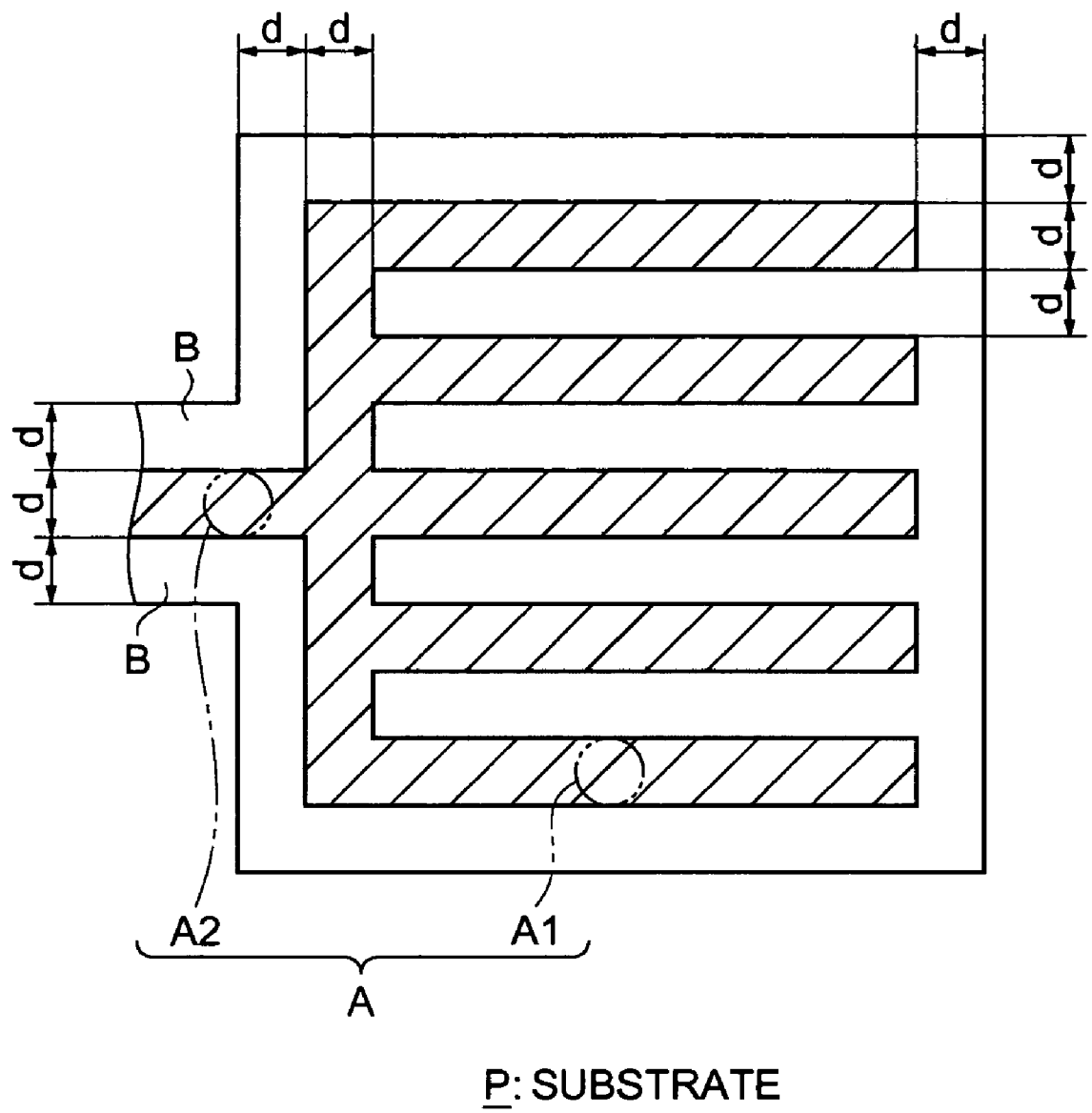
FIG. 7 is a pattern diagram showing a thin film pattern substrate as a second embodiment.

FIG. 7 is a pattern diagram showing a film pattern substrate as a second embodiment.

As shown in FIG. 7, the film pattern is configured so that the first area A1 may be pectinate, in the forming of the banks B on the substrate P, on the striated area A comparted by the banks B. The second area A2 is in connection to the first area A1. The line width d of the first area A1 and the line width d of the second area A2 are configured to be equal.

When a functional liquid L is dropped on the first area A1, the functional liquid L becomes semispherical due to the power of the surface tension to stabilize. However, when the functional liquid L is dropped successively onto the first area A1, the functional liquid L starts to flow into the second area A2 along the pectinate groove that is formed on the striated area A. When the dropping of a predetermined amount of functional liquid L is completed, the shape of the functional liquid L1 dropped onto the first area A1 and the shape of the functional liquid L2 on the second area A2 become almost hog-backed because the first area A1 and the second area A2 are thinly grooved, which equalizes the pressure P1 on the first area A1 and the pressure P2 on the second area A2. Further, the height h1 of the curvature on the first area A1 and the height h2 of the curvature on the second area A2 become almost equal, and are stabilized just like in the first embodiment (refer to FIGS. 6B and 6C).

In the above-mentioned second embodiment, the following effects can be achieved, in addition to the effects achieved in the first embodiment.

4. A thin film pattern substrate having a pectinate first area A1, which is adoptable for a terminal part of optical elements or the like, can be formed.

Third Embodiment

Next, a third embodiment of the invention will be described. The third embodiment is different from the first and second embodiments in that it uses a different shape, wherein a complicated pattern is placed on the striated area A with the banks B and the area is subdivided in a manner that the line width d is uniform. Here, the same symbols are used for the same components and the components having the same features as those in the first and second embodiments, and the explanations are spared.

Figure 8:
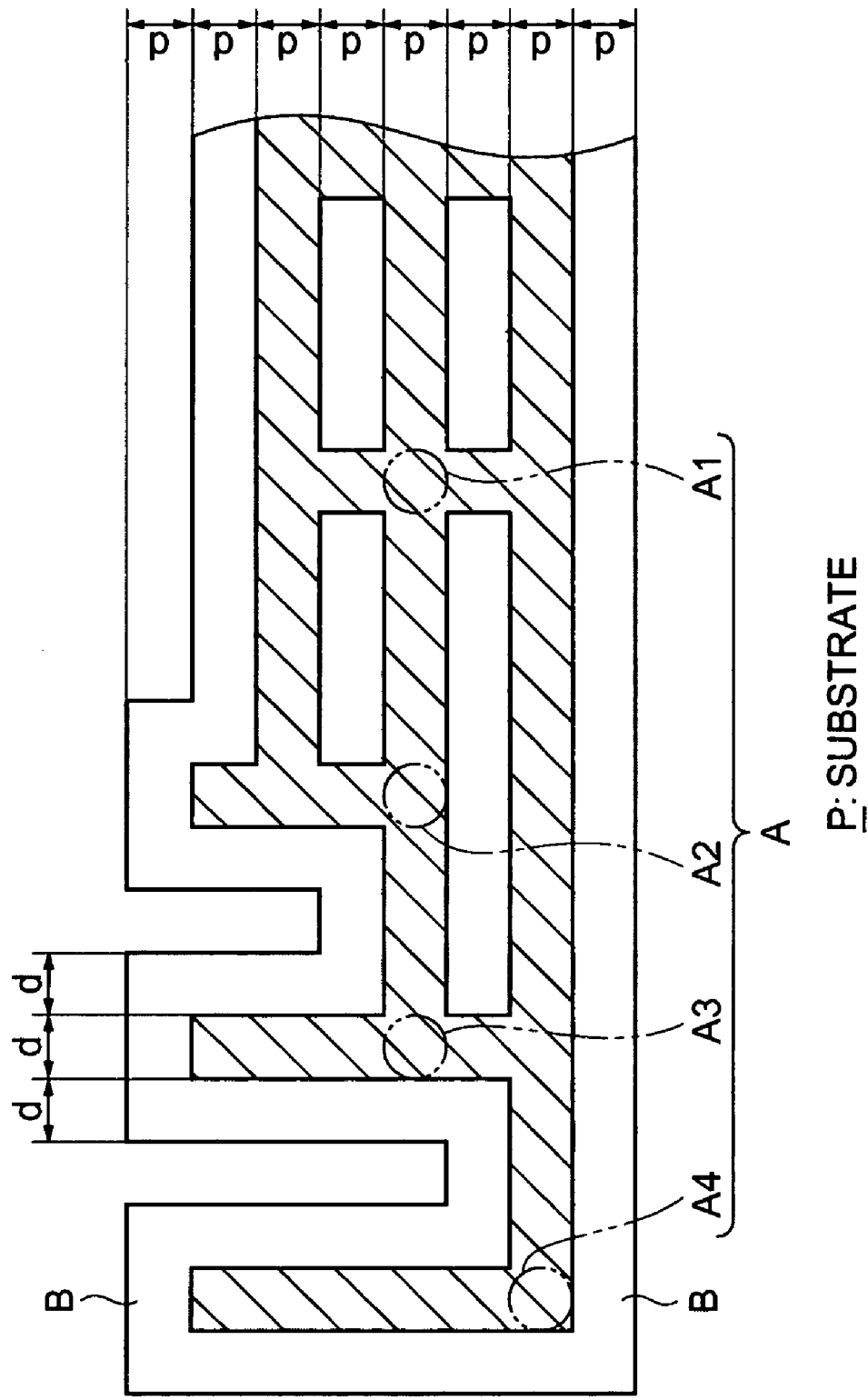
FIG. 8 is a pattern diagram showing a thin film pattern substrate as a third embodiment.

FIG. 8 is a pattern diagram showing a thin film pattern substrate as a third embodiment.

As shown in FIG. 8, the thin film pattern has, in the forming of the banks B on the substrate P, on the striated area A that is comparted by the banks B a first area A1 on which a functional liquid L is dropped, and a second area A2, a third area A3, and a fourth area A4 are placed in connection to each other in the direction into which the functional liquid L flows. The line width d of the first area A1, the second area A2, the third area A3, and the fourth area A4 are configured to be equal.

When the functional liquid L is dropped onto the first area A1, the functional liquid L becomes semispherical due to the power of the surface tension to stabilize. However, when the functional liquid L is dropped successively onto the first area A1, the functional liquid L starts to flow into the second area A2 along the linear pattern that is formed on the striated area A, gradually flowing thorough to the third area A3 and then to the fourth area A4. When the dropping of the functional liquid L is completed, the shape of the functional liquid L1 that is dropped on the first area A1 and the shapes of the functional liquids L2 to L4 on the second to fourth area A2 to A4 become almost hog-backed and are stabilized. Thus, the pressure P1 of the functional liquid L1 on the first area A1, the pressure P2 of the functional liquid L2 on the second area A2, the pressure P3 of the functional liquid L3 on the third area A3, and the pressure P4 of the functional liquid L4 on the fourth area A4 equal just like in the first embodiment. Further, the height h1 of the curvature on the first area A1 and the height h2 of the curvature on the second area A2 become almost equal, and are thus stabilized just like in the first embodiment (refer to FIGS. 6B and 6C).

In the above-mentioned third embodiment, the following effects can be achieved, in addition to the effects achieved in the first and second embodiments.

5. A complicated thin film pattern substrate can be formed by configuring the first area A1, the second area A2, the third area A3, and the fourth area A4 that constitute the striated area A in connection with a uniform line width d. Thus, it can be adopted for complicated circuit boards, such as a print wiring substrate or the like.

Electro-Optic Device

Figure 10:
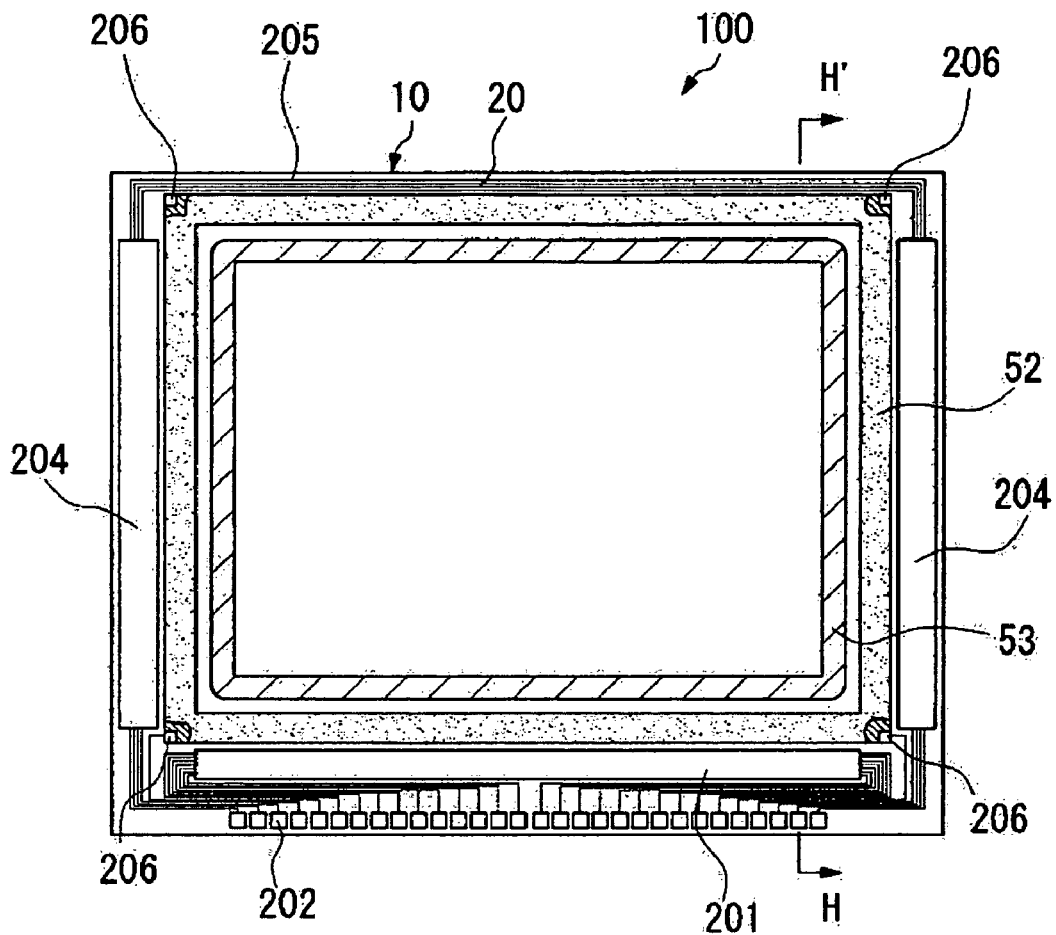
FIG. 10 is a two-dimensional diagram showing a liquid crystal display seen from the side of a facing substrate.
Figure 11:
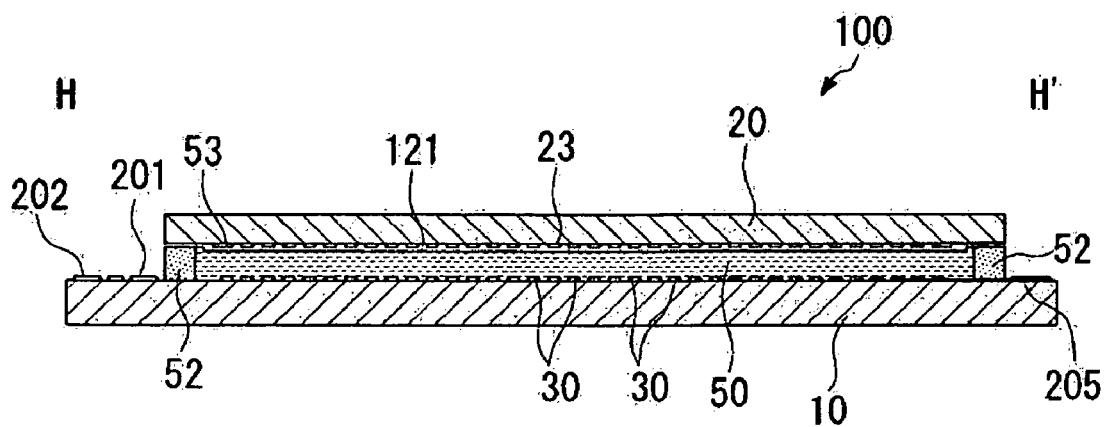
FIG. 11 is a sectional view along line H-H' in FIG. 10.
Figure 12:
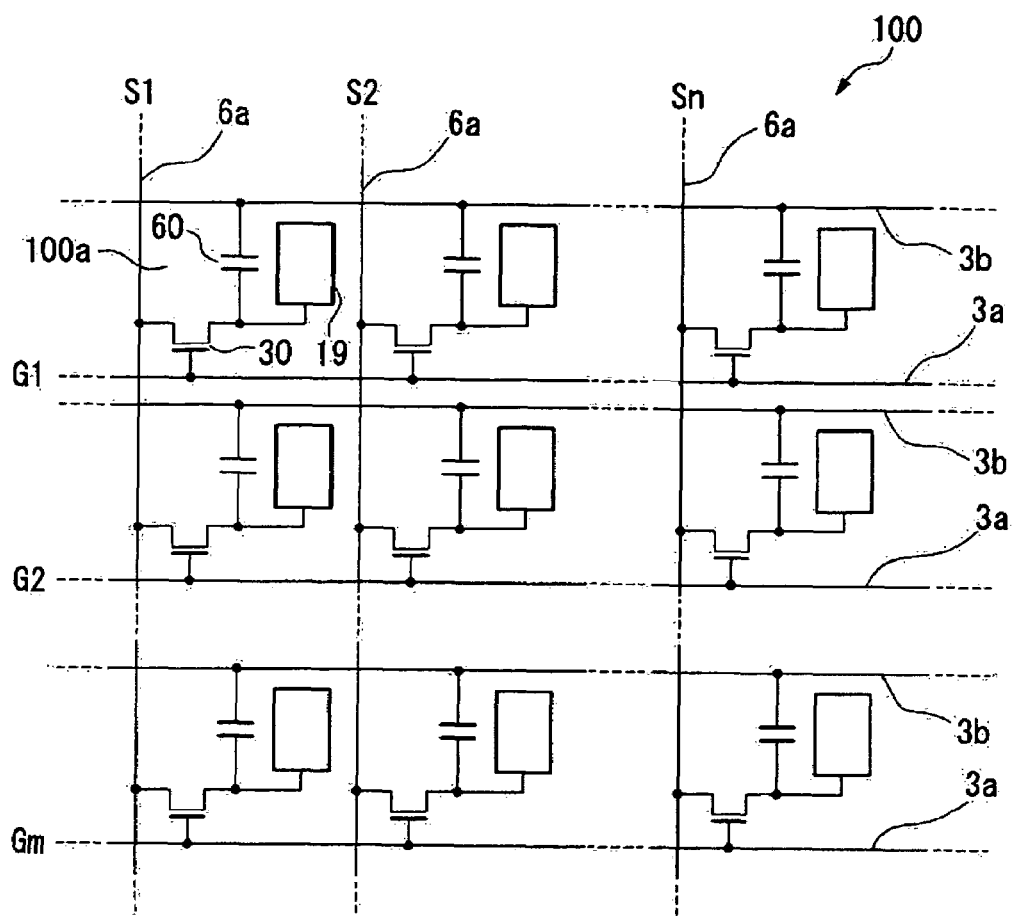
FIG. 12 is an equivalent circuit diagram of a liquid crystal display.
Figure 13:
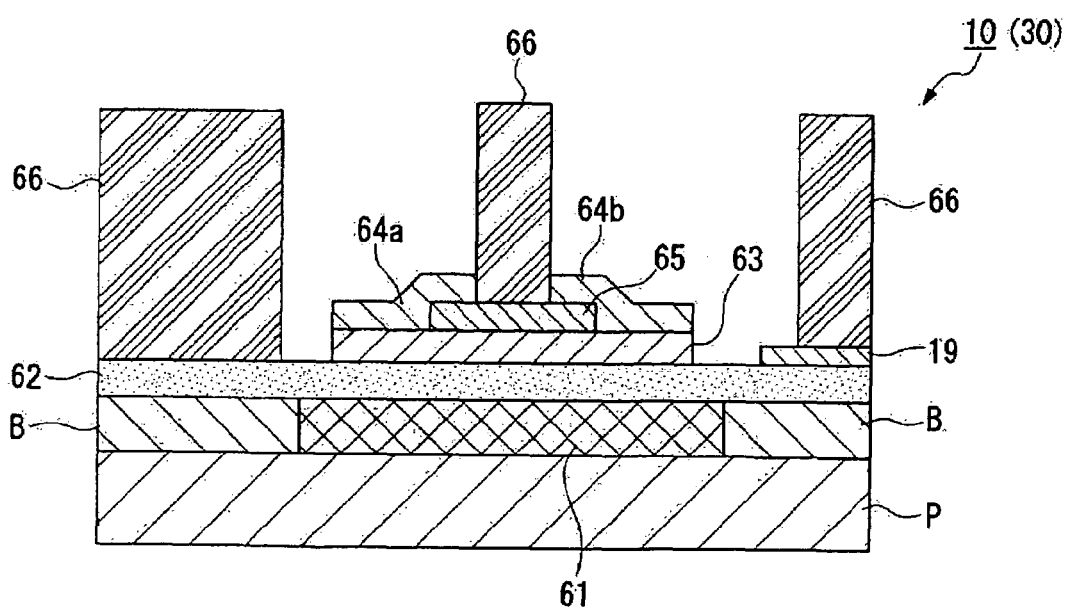
FIG. 13 is a partly enlarged sectional view of a liquid crystal display.

Now, a liquid crystal display, which is an example of electro-optic devices of the invention, will be described. FIG. 10 is a two-dimensional diagram showing a liquid crystal display of the invention seen from the side of a facing substrate with each component part. FIG. 11 is a sectional view along line H-H' in FIG. 10. FIG. 12 is an equivalent circuit diagram of various elements, wirings, and the like on a plurality of pixels that is formed in a matrix on the image display area on the liquid crystal display. FIG. 13 is a partly enlarged sectional view of a liquid crystal display. In each of the drawings to be used in the following explanation, the scale sizes of each layer and each component are accordingly changed so that the layers and components can be drawn in recognizable sizes.

In FIGS. 10 and 11, the liquid crystal display (an electro-optic device) 100 of the embodiment includes a TFT array substrate 10 and a facing substrate 20 as a pair. The substrates are pasted up with a seal material 52, which is a light indurative sealant, and liquid crystal 50 is inserted and retained within the area that is comparted by the seal material 52. The seal material 52 is formed in a frame shape, enclosed within an area on the substrate surface.

Inside the area on which the seal material 52 is placed, a peripheral border 53 composed of a light blocking material is formed. Outside the area for the seal material 52, a data line drive circuit 201 and a mounting terminal 202 are formed along a first side of the TFT array substrate 10, with scanning line drive circuits 204 being formed along the two sides that are adjacent to the first side. On the remaining side of the TFT array substrate 10, a plurality of wirings 205 is placed for connecting the space between the scanning line drive circuits 204 that are placed on both sides of the image display area.

Further, on at least one of the corners of the facing substrate 20, an intersubstrate conductive material 206 is placed for assuring electrical conduction between the TFT array substrate 10 and the facing substrate 20.

Instead of forming the data line drive circuit 201 and the scanning line drive circuits 204 on the TFT array substrate 10, it is also acceptable, for example, to electrically and mechanically connect a TAB (Tape Automated Bonding) substrate on which a driving LSI is installed and terminal group that is formed on the periphery of the TFT array substrate 10 via an anisotropic conductive film. Here, although a phase difference plate, a deflecting plate, and the like are placed on the liquid crystal display 100 in predetermined directions according to the types of the liquid crystal 50 to be used, like operation modes, such as TN (Twisted Nematic) mode, STN (Super Twisted Nematic) mode, or the like, and to the difference of modes, such as normally white mode or normally black mode, the diagrammatic representation is omitted. Further, in the case where a liquid crystal display 100 is configured for color display, color filters, for example, for red (R), green (G), and blue (B) are set up, along with its overcoat, on the corresponding areas on the facing substrate 20 that face each of the pixel electrodes (to be described later) on the TFT array substrate 10.

In the image display area of the liquid crystal display 100 having this kind of structure, a plurality of pixels 100a is configured in a matrix, as shown in FIG. 12. For each of these pixels 100a, a TFT (a switching element) 30 is formed for pixel switching, with a data line 6a for supplying pixel signals S1, S2, . . . Sn being electrically connected to the source of TFT 30. The pixel signals S1, S2, . . . Sn to be written onto the data line 6a can be supplied either sequentially in this order or per group to a plurality of data lines 6a that is adjacent to each other. Further, a scanning line 3a is electrically connected to the gate of TFT 30 so that scanning signals G1, G2, . . . Gn are applied to the scanning line 3a sequentially in this order, like pulse, at a predetermined timing.

A pixel electrode 19 is electrically connected to a drain of TFT 30, and writes the pixel signals S1, S2, . . . Sn supplied from the data line 6a into each of the pixels at a predetermined timing by keeping TFT 30, which is a switching element, turned on for a predetermined period. Thus, the pixel signals S1, S2, . . . Sn at a predetermined level that are written into the liquid crystal via the pixel electrode 19 are retained for a predetermined period between the facing substrate 20 and a facing electrode 121, as shown in FIG. 11. For preventing the retained pixel signals S1, S2, . . . Sn from leaking, an accumulative capacity 60 is added in parallel with the liquid crystal capacity that is formed between the pixel electrode 19 and the facing electrode 121. For example, the voltage of the pixel electrode 19 is retained by the accumulative capacity 60 for a triple-digit longer time than the time for which the source voltage is applied. Thus, the retention property of charge is improved, making it possible to realize a liquid crystal display 100 having a high contrast ratio.

FIG. 13 is a partly enlarged sectional view of a liquid crystal display 100 having a bottom-gate TFT 30. On the glass substrate P forming TFT array substrate 10, a gate wiring 61 is formed between the banks B and B on the substrate P by using a wiring pattern forming method in the above-referenced embodiments.

On the gate wiring 61, a semiconductor layer 63 composed of amorphous silicon (a-Si) layers is formed by lamination via a gate insulating film 62 composed of SiNx. The part of the semiconductor layer 63 that faces the gate wiring part is supposed to be a channel area. Junction layers 64a and 64b composed, for example, of n-type a-Si layers for gaining an ohmic junction are formed by lamination on the semiconductor layer 63, and an insulative etch stop film 65 composed of SiNx for securing the channel is formed on the center part of the channel area on the semiconductor layer 63. The gate insulating film 62, the semiconductor layer 63, and the etch stop film 65 are patterned, as shown in the drawing, as a result of resist application, exposure and development, and photo etching after chemical vapor deposition (CVD).

Further, a film is formed likewise also for the pixel electrode 19 composed of junction layers 64a and 64b and ITO, and a patterning is done, as shown in the drawing, by photo-etching. Then, a bank 66 is protrudently formed respectively onto the pixel electrode 19, the gate insulating film 62, and the etch stop film 65. A source line and a drain line can be formed by discharging a droplet of silver compound between these banks 66 using the above-mentioned droplet discharge device IJ.

Although TFT 30 is used as a switching element for driving a liquid crystal display 100 in the above-mentioned embodiment, it is also applicable, in addition to a liquid crystal display, for an organic EL (Electro-Luminescence) display device, for example. An organic EL display device is an element that has a configuration in which a thin film containing fluorescent inorganic and organic compounds is interposed between cathode and anode, making it irradiate by utilizing the light emission (fluorescence and phosphorescence) in the deactivating of the exciton that is generated by infusing electrons and holes into the thin film and recombining them. Then, a self-luminous full color EL device can be manufactured by patterning, on the substrate having TFT 30, the each of the inks, which are materials that take on each luminous color of red, green, and blue among the fluorescent materials used for an organic EL display element, or a luminous layer forming material, and a forming material of hole infusing/electronic transport layers. The organic EL device is also included in the range of devices (electro-optic devices) of the invention.

Figure 14:
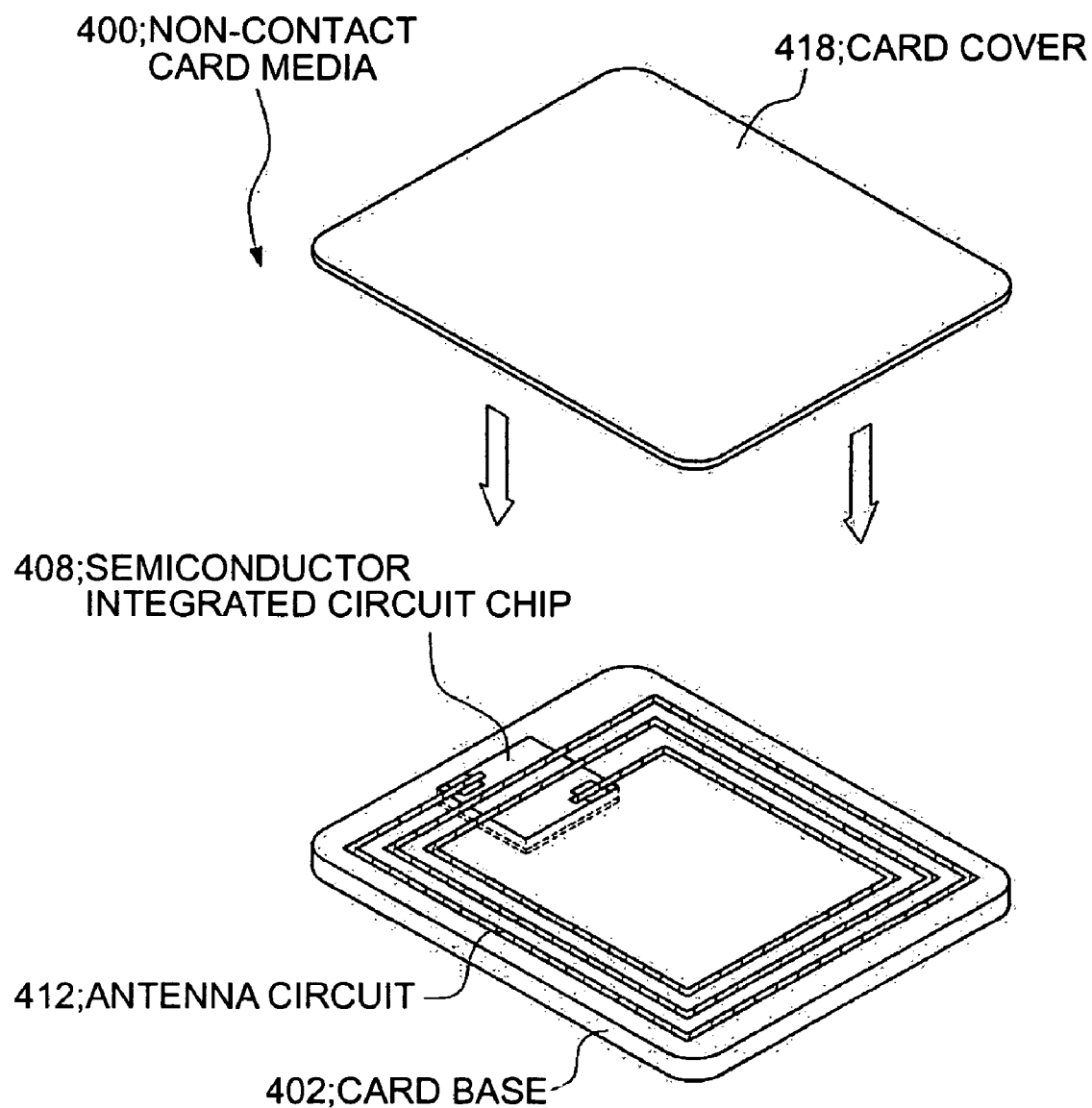
FIG. 14 is an oblique diagram of a non-contact card media.

As another embodiment, an embodiment of a non-contact card media will be now described. As shown in FIG. 14, a non-contact card media (an electronic device) 400 according to the embodiment has a semiconductor integrated circuit chip 408 and an antenna circuit 412 within a case consisted of a card base 402 and a card cover 418. Here, both or either of the electricity supply and the giving and receiving of data is carried out with an external transmitter-receiver (not shown) via both or either of the electromagnetic waves and the electrostatic capacity combination. In the embodiment, the antenna circuit 412 is formed according to the wiring pattern forming method of the embodiment.

Electro-optic devices of the embodiment includes, in addition to the above-referenced device, such as a PDP (plasma display panel) and a surface conductive electron emission element using a phenomenon that electron emission is generated by passing electric current parallel to the film surface on the thin film of a small dimension that is formed on the substrate.

Electronic Device

Figure 15A:
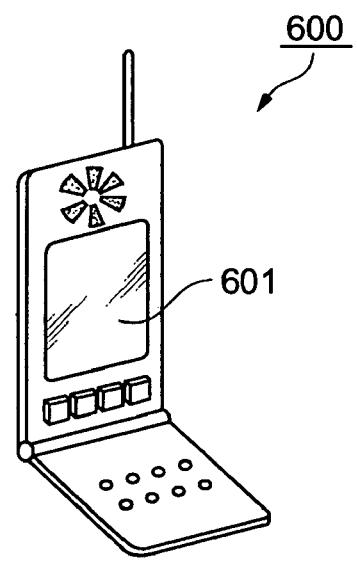
FIGS. 15A, 15B and 15C are diagrams showing concrete examples of electronic apparatuses, FIG. 15A being an oblique diagram of a cellular phone, FIG. 15B being an oblique diagram of a personal computer, and FIG. 15C being an oblique diagram of a wrist watch.
Figure 15B:
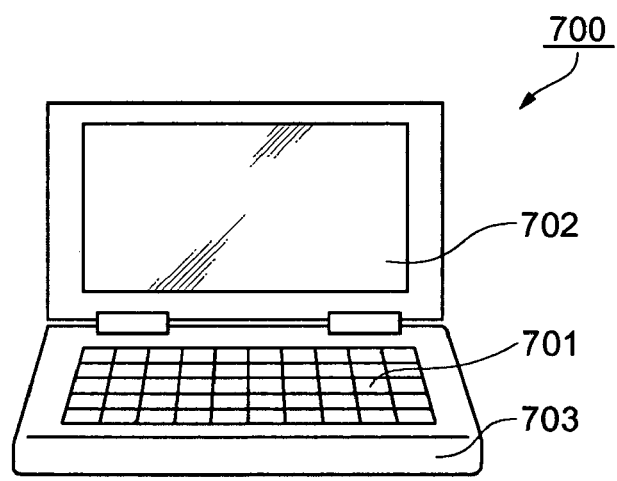
Figure 15C:
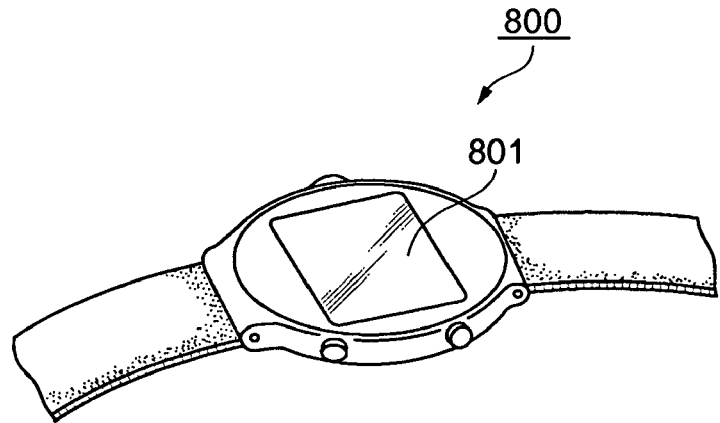

A concrete example of electronic devices of the invention will be now described. FIG. 15A is an oblique diagram showing an example of a cellular phone. In FIG. 15A, 600 refers to the main body of the cellular phone, and 601 refers to a liquid crystal display part including a liquid crystal display of the embodiment. FIG. 15B is an oblique diagram showing an example of portable information processing terminal devices, such as a word processor or a personal computer. In FIG. 15B, 700 refers to an information processing unit, 701 to an input part, such as a keyboard, 703 to an information processing body, and 702 to a liquid crystal display part including a liquid crystal display of the embodiment. FIG. 15C is an oblique diagram showing an example of wristwatch type electronic devices. In FIG. 15C, 800 refers to the main body of a watch, and 801 refers to a liquid crystal display part including a liquid crystal display of the embodiment.

The electronic devices shown in FIGS. 15A, 15B, and 15C have a liquid crystal display of the embodiment and a wiring pattern the line of which is thinned appropriately. Further, although the electronic device of the invention has a liquid crystal display, electronic devices having other kinds of electro-optic devices, such as organic EL (Electro-Luminescence) display device, a plasma display unit, or the like, are also acceptable.

The invention is not limited to the above-referenced embodiments. Any modification and improvement is included in the invention as long as the purpose of the invention can be achieved. Now, some examples of modification will be described.

MODIFICATION EXAMPLE 1

Although the bank is formed and liquid repellency is added to the bank, in the first, second, and third embodiments, it is not limited to this. A desired wiring pattern can be formed, for example, by carrying out surface treatment on the substrate, carrying out lyophilic treatment on the wiring pattern forming area, carrying out repellency treatment on the remaining part, and placing an ink that includes conductive microparticles, organic silver compound or the like on the part on which the repellency treatment is carried out.

MODIFICATION EXAMPLE 2

Although a thin film pattern is a conductive film in the first, second, and third embodiments, it is not limited to this. It is also applicable, for example, for color filters that are used for colorizing the image to be displayed on a liquid crystal display device. The color filters can be formed by placing on the substrate an ink in red (R), green (G), and blue (B) as a droplet with a predetermined pattern. A liquid crystal display device having high-quality color filters can be manufactured by forming a bank on the substrate according to a predetermined pattern and by placing an ink, after repellency property is added on the bank, to form color filters.

MODIFICATION EXAMPLE 3

Although the first area A1 is aligned in a lattice or in a pectination in the first and second embodiments, it is not limited to this. It can be aligned, for example, in a ring shape by making the line width d uniform.

By doing this, a thin film pattern substrate in a ring shape can be generated, in addition to achieving the similar effects of the first and second embodiments.

MODIFICATION EXAMPLE 4

Although a thin film forming process is adopted in forming a groove in the first, second, and third embodiments, the invention is not limited to this. It can also be formed using, for example, etching.

By doing this, a complicated process for forming a thin film is not needed, in addition to achieving the similar effects in the first, second, and third embodiments.

What is claimed is:

1. A method for manufacturing a thin film pattern substrate, comprising:
    forming a hexamethyl disilazane (HDMS) layer on a substrate as an adhesion layer;
    forming a first domain area by forming a plurality of first banks having a tapered shape that protrude from the substrate on the HDMS layer, the plurality of first banks forming a plurality of first linear patterns; and
    forming a second domain area by forming a plurality of second banks having a tapered shape that protrude from the substrate on the HDMS layer, the plurality of second banks forming a second linear pattern that is in communication with the plurality of first linear patterns of the first domain area to define a flow path that connects the first domain area and the second domain area;
    after forming the first banks and the second banks, adding a lyophilic property to first regions between the plurality of first banks and second regions between the plurality of second banks using $O_2$ plasma;
    adding a repellant property to the plurality of first banks and the plurality of second banks using $CF_4$ plasma;
    infusing a functional liquid by droplet discharge of a plurality of droplets to the first regions between the plurality of first banks of the first domain area, the droplets each having a diameter that is greater than a width between first banks;
    while infusing the functional liquid by droplet discharge to the first regions, flowing the functional liquid from the first domain area along the flow path and to the second domain area utilizing a surface tension of the functional liquid, a width between the first banks, a width between the second banks, and pressures in the first domain area and the second domain area, said pressures in the first domain area and the second domain area being equal;
    drying the functional liquid to form a wiring pattern; and
    removing the banks.

2. The method according to claim 1, wherein the plurality of first banks of the first domain area are formed in a pectination.

3. The method according to claim 1, wherein the functional liquid is conductive.

4. The method according to claim 1, wherein the first regions between the plurality of first banks define a plurality of first line widths of the first domain area, the second regions between the plurality of second banks define a second line width of the second domain area, the first and second line widths being almost equal.

5. A thin film pattern substrate formed according to the method of claim 1.

6. An electro-optic device having the thin film pattern substrate of claim 5.

7. An electronic apparatus that includes an electro-optic device according to claim 6.

* * * * *